United States Patent
El-Diwany et al.

(10) Patent No.: US 7,687,887 B1
(45) Date of Patent: Mar. 30, 2010

(54) METHOD OF FORMING A SELF-ALIGNED BIPOLAR TRANSISTOR STRUCTURE USING A SELECTIVELY GROWN EMITTER

(75) Inventors: Monir El-Diwany, Saratoga, CA (US); Alexei Sadovnikov, Sunnyvale, CA (US); Jamal Ramdani, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 655 days.

(21) Appl. No.: 11/607,265

(22) Filed: Dec. 1, 2006

(51) Int. Cl.
   *H01L 21/00* (2006.01)
(52) U.S. Cl. .......... 257/565; 257/592; 257/588
(58) Field of Classification Search .......... 257/565, 257/592, 588
   See application file for complete search history.

(56) References Cited

U.S. PATENT DOCUMENTS

| | | | |
|---|---|---|---|
| 4,047,975 A * | 9/1977 | Widmann | 438/348 |
| 4,309,812 A * | 1/1982 | Horng et al. | 438/374 |
| 4,392,149 A * | 7/1983 | Horng et al. | 257/518 |
| 5,059,544 A | 10/1991 | Burghartz et al. | 437/31 |
| 5,081,518 A * | 1/1992 | El-Diwany et al. | 257/754 |
| 5,093,272 A | 3/1992 | Hoepfner et al. | 437/31 |
| 5,766,990 A * | 6/1998 | El-Diwany | 438/202 |
| 5,940,711 A * | 8/1999 | Zambrano | 438/366 |
| 6,177,325 B1 | 1/2001 | Jang | 438/318 |
| 6,528,862 B1 * | 3/2003 | Sadovnikov | 257/565 |
| 6,534,372 B1 | 3/2003 | Racanelli | 438/321 |
| 6,686,251 B2 * | 2/2004 | Igarashi | 438/364 |
| 6,759,731 B2 | 7/2004 | Chen | 257/592 |
| 6,869,853 B1 | 3/2005 | Gopalan | 438/321 |
| 6,964,907 B1 * | 11/2005 | Hopper et al. | 438/318 |
| 6,967,144 B1 * | 11/2005 | Sadovnikov | 438/350 |
| 6,979,884 B2 * | 12/2005 | Ahlgren et al. | 257/588 |
| 6,989,557 B2 | 1/2006 | Chen | 257/197 |
| 7,026,666 B2 * | 4/2006 | Kalnitsky et al. | 257/190 |
| 7,105,415 B2 * | 9/2006 | Bock et al. | 438/309 |
| 7,521,310 B1 * | 4/2009 | Vashchenko et al. | 438/203 |
| 7,566,626 B1 * | 7/2009 | Xu et al. | 438/343 |
| 7,572,708 B1 * | 8/2009 | Babcock et al. | 438/369 |
| 2005/0233536 A1 * | 10/2005 | Bock et al. | 438/350 |
| 2009/0179303 A1 * | 7/2009 | Heinemann et al. | 257/586 |

* cited by examiner

*Primary Examiner*—Laura M Menz
(74) *Attorney, Agent, or Firm*—Dergosits & Noah LLP

(57) ABSTRACT

A method for forming a self-aligned bipolar transistor structure uses the selective growth of a doped silicon emitter in a sloped oxide emitter window to form the self-aligned structure. In an alternate process flow, the top emitter layer is SiGe with a high Ge content that is etched off selectively after deposition of the extrinsic base layer. In another alternate flow, a nitride plug formed on top of the emitter blocks the extrinsic base implant from the emitter region.

20 Claims, 16 Drawing Sheets

METHOD OF FORMING A SELF-ALIGNED BIPOLAR TRANSISTOR STRUCTURE USING A SELECTIVELY GROWN EMITTER

FIELD OF THE INVENTION

The present invention relates to semiconductor integrated circuits and, in particular, to the fabrication of a self-aligned bipolar transistor structure using selective growth of a doped monocrystalline/polycrystalline emitter in an oxide window.

BACKGROUND OF THE INVENTION

U.S. Pat. No. 6,979,884 ("the '884 patent"), which issued on Dec. 27, 2005, discloses techniques for fabricating bipolar transistor structures. FIG. 1 shows a partial bipolar transistor structure 100 disclosed in the '884 patent. The FIG. 1 partial bipolar transistor structure 100 includes a silicon-containing substrate 102 having isolation regions 104, e.g. trench isolation or field oxide isolation, formed therein. The substrate 102 also includes a collector region 108 and a collector contact region 106. A patterned protective material, such as oxide or nitride or oxynitride, is formed on top of selected portions of the device area. The structure 100 also includes a base region that comprises intrinsic base portion 112 and surrounding extrinsic base layer 114. The intrinsic base 112 comprises silicon (Si) or germanium (Ge) or a combination of silicon and germanium. The intrinsic base 112 is typically monocrystalline, while the extrinsic base 114 is typically polycrystalline silicon or SiGe. An emitter opening 118 is formed within a dielectric (e.g. oxide) layer 116 and raised extrinsic base 114. Within the emitter opening 118 is an oxide layer 120 and annular insulating spacer 122. The insulating spacer 122 is typically referred to as an "inside" spacer because it is formed within the opening 118 in the dielectric layer 116. The inside spacer 122 is a dielectric such as oxide or nitride. As shown in FIG. 1, the dielectric layer 116 and the underlying extrinsic base layer 114 form a raised extrinsic base/dielectric stack.

Those skilled in the art will appreciate that the inside spacer 122 is utilized to define the final dimension of the emitter of the bipolar transistor structure and to provide lateral emitter-base isolation. Those skilled in the art will also appreciate that, as device sizes become smaller (e.g., 0.18 μm processes), thus reducing the size of the emitter window, the ability to utilize inside spacers to define the emitter dimension and to obtain adequate emitter-base isolation becomes increasingly problematic.

There is an increasing desirability in the electronics industry, particularly with respect to handheld, wireless devices, for the use of integrated circuits that combine the high speed, high gain advantages of bipolar transistor technology with the simple, low power logic associated with CMOS technology. While circuit designers recognize the advantages of this so-called "BiCMOS" technology, the very high level of integration that can be achieved with CMOS technology still cannot be realized with BiCMOS technology. Thus, it is highly desirable to reduce the size of bipolar devices.

Circuit designers are relying on self-aligned bipolar architectures to achieve the narrower emitters and more critical extrinsic/intrinsic base alignments necessary for reduced bipolar device size. Many of these bipolar architectures achieve self-alignment through the use of sacrificial emitters.

U.S. Pat. No. 6,869,853 ("the '853 patent"), which issued on Mar. 22, 2005, discloses techniques for fabricating a bipolar transistor structure using a sacrificial emitter.

FIGS. 2A-2E show a sequence of steps for fabricating a bipolar structure using the sacrificial emitter techniques of the '853 patent. As shown in FIG. 2A, isolation structures 202, such as shallow trench isolation (STI) silicon dioxide, are formed in an amorphous silicon layer 201. A polycrystalline silicon-germanium layer 204 and a silicon or silicon-germanium layer 203 are formed on isolation structures 202 and silicon layer 201, respectively, by epitaxial growth. The portion of the layer 203 that will be under a subsequently formed emitter is referred to as an "intrinsic base region", while the remainder of the layer 203 and the poly-SiGe layer 204 as "extrinsic base regions." As shown in FIG. 2B, an oxide layer 213, e.g. silicon dioxide, is then formed and a polycrystalline silicon layer 211 is formed over the oxide layer 213. Polycrystalline silicon layer 211 serves as the sacrificial emitter material, and therefore does not require an implantation step or an activation step. As further shown in FIG. 2B, a photoresist (PR) sacrificial emitter mask 241 is patterned on the polysilicon layer 211 for use in defining the sacrificial emitter. As shown in FIG. 2C, the patterned photoresist mask 241 is then used to etch the polysilicon layer 211 to form the sacrificial emitter 211'. Spacers 212, e.g. silicon nitride, are then formed on the outside sidewalls of the sacrificial emitter 211', as shown in FIG. 2D. Portions of the oxide layer 213 that are not under the sacrificial emitter 211' and the sidewall spacers 212 are then removed and an extrinsic base implant step is performed, as shown in FIG. 2E. As can be appreciated by reference to FIG. 2E, the extrinsic base implant step is self-aligned with respect to the spacers 212. As shown in FIG. 2F, a layer of conformal oxide 221 is then formed over the FIG. 2E structure and etched back to expose the polysilicon sacrificial emitter 211'. The sacrificial emitter 211' is then removed, as shown in FIG. 2G, using a poly-etch process that is selective to the sidewall spacers 212 and to oxide layers 221 and 213. A portion of the oxide layer 213 is then removed to expose a portion of layer 203. A layer of emitter material, e.g. polysilicon, is then formed, doped, activated and etched to form polysilicon emitter 231 of the bipolar transistor structure, as shown in FIG. 2H.

Those skilled in the art will appreciate that a sacrificial emitter process of the type described above involves the deposition and etch back of multiple layers of polysilicon and dielectrics. This inevitably results in some residues being left behind in each such operation, potentially resulting in operational degradation and, thus, yield loss. Furthermore, as the critical dimensions in these bipolar devices decrease, the tradeoffs in the lightly doped extrinsic base implant and the need to minimize extrinsic base to collector capacitance become more problematic.

U.S. Pat. No. 7,026,666 ("the '666 patent"), which issued on Apr. 11, 2006, shows another self-aligned technique for fabricating a bipolar transistor structure.

Referring to FIG. 3A, the technique disclosed in the '666 patent includes the formation of a structure that comprises a p-type silicon substrate 302 having an n-type collector region 304 and a p-type Si, SiGe or SiGe:C epitaxial layer 306. The epitaxial layer 306 is deposited over the surface of the substrate 302 such that a mono crystalline portion 308 of the epitaxial layer 306 is deposited over a mono crystalline portion 310 of the substrate 302 and a poly crystalline portion 312 of the epitaxial layer 306 is deposited over isolation oxide 314. An ONO stack 316 comprising thin silicon dioxide layer 318, silicon nitride layer 320 and top silicon dioxide layer 322, is formed on the substrate 302.

Referring to FIG. 3B, an emitter mask layer (not shown) is then formed over the top oxide layer 322 and utilized to selectively etch the top oxide layer 322 and the nitride layer 320 to form an emitter window 324; the thin oxide layer 318 is left in place as an etch stop. A self-aligned collector implant is then performed through the emitter window 324. The thin oxide layer 318 is then etched to expose a portion of the epi portion 308 and a layer of polysilicon 328 is formed over the structure. The polysilicon layer 328 may be in-situ doped with n-type dopant while deposited by low pressure chemical vapor deposition (LPCVD). A polysilicon emitter 330 is then formed by etching back the polysilicon layer 328 such that the top surface of the poly emitter 330 is coplanar with the top surface of the top oxide layer 322, as shown in FIG. 3C. The poly emitter 330 is then exposed by selectively removing the top oxide layer 322, resulting in the structure shown in FIG. 3D.

Referring to FIG. 3E, nitride spacers 132 are then formed on the exposed sidewalls of the poly emitter 330 by depositing a layer 324 of silicon nitride and anisotropically etching the nitride layer 324. As shown in FIG. 3F, the thin oxide layer 318 is then removed and a heavily doped epitaxial layer 340 is selectively deposited over the base epitaxial region 306 and over the poly emitter 330. Referring to FIG. 3G, the thickness of the nitride spacer 332 is then increased forming and etching nitride layer 350 to provide thicker spacers 350, thereby increasing the width of the emitter region 342 in order to prevent the emitter silicide layer from shorting with the base silicide and in order to prevent the emitter contact etch from exposing the base region 344.

FIG. 3H shows the formation of a silicide layer 354 at the surface of the raised extrinsic base region 344 and at the top surface of the emitter region 342. Those skilled in the art will appreciate that the emitter structure is completed by forming an emitter contact to the silicided upper surface 354 of the emitter region 342.

DETAILED DESCRIPTION OF THE INVENTION

The present invention departs significantly from the concept of utilizing a sacrificial emitter to achieve self-alignment in a bipolar transistor structure. A bipolar device architecture in accordance with the concepts of the present invention utilizes a selective or a non-selective in-situ doped emitter to achieve self-alignment, thereby completely eliminating all complexities associated with the sacrificial emitter techniques.

A process flow for fabricating an NPN bipolar transistor structure in accordance with the concepts of the present invention is described below in conjunction with FIGS. 4A-4H.

Figure 1:
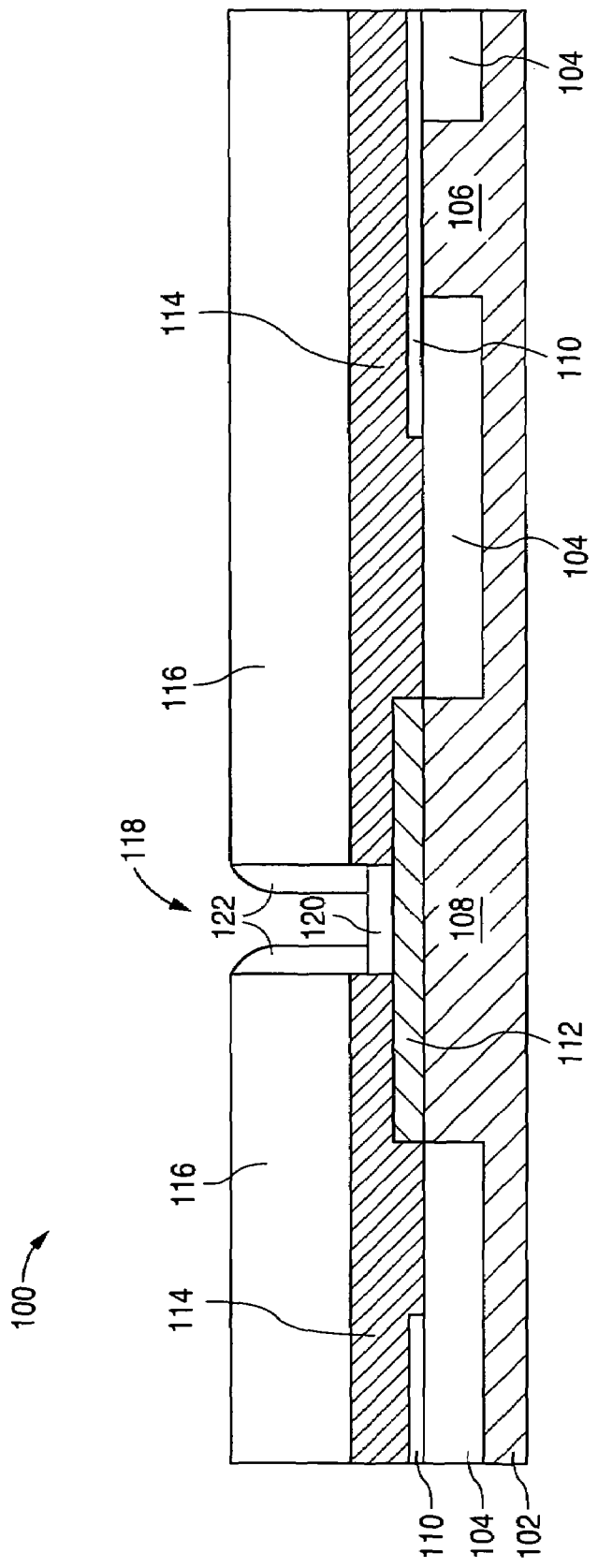
FIG. 1 is a cross section drawing illustrating a prior art partial bipolar transistor structure that utilizes inside spacers to define the emitter dimension of the transistor structure.
Figure 2A:
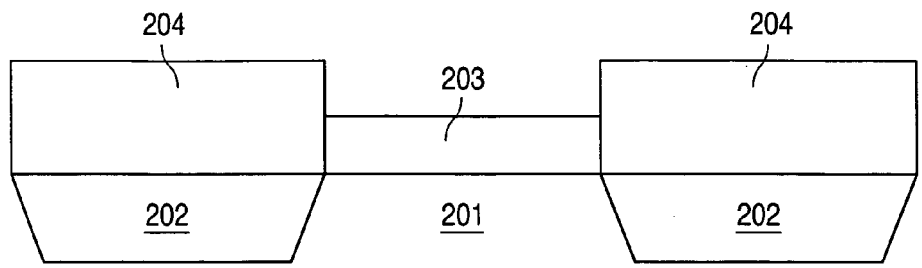
FIGS. 2A-2H are cross section drawings illustrating a prior art sequence of steps for fabricating a self-aligned bipolar transistor structure utilizing a sacrificial emitter.
Figure 2B:
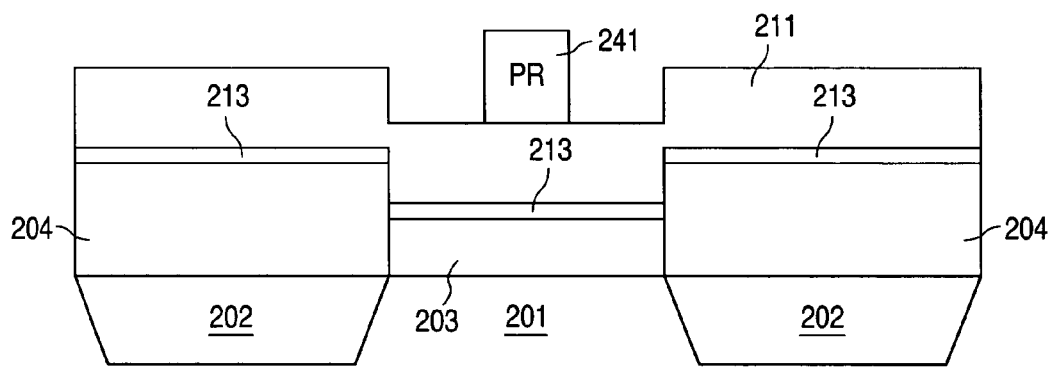
Figure 2C:
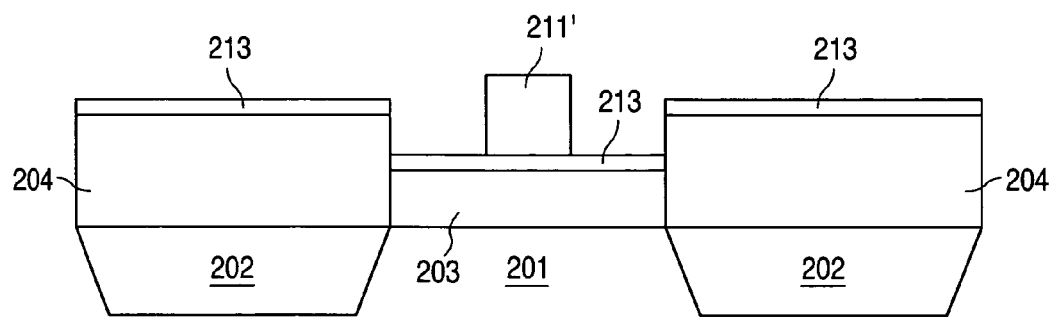
Figure 2D:
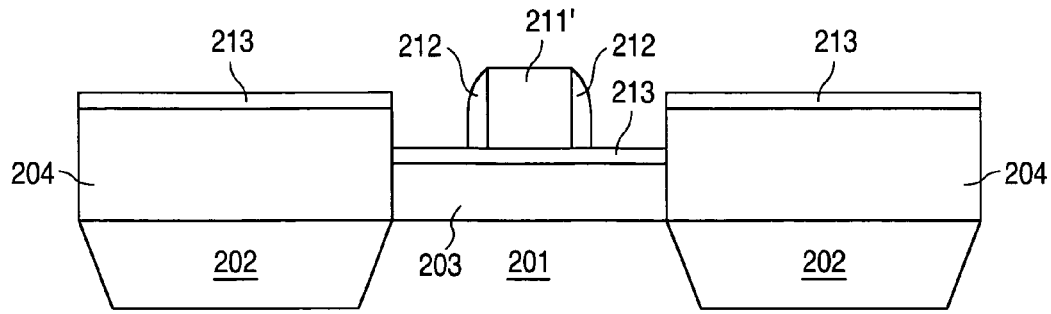
Figure 2E:
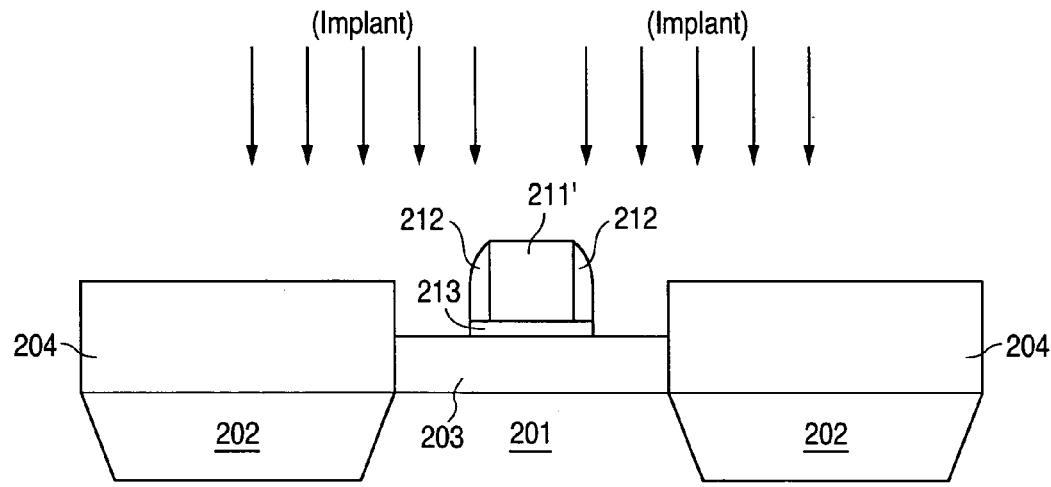
Figure 2F:
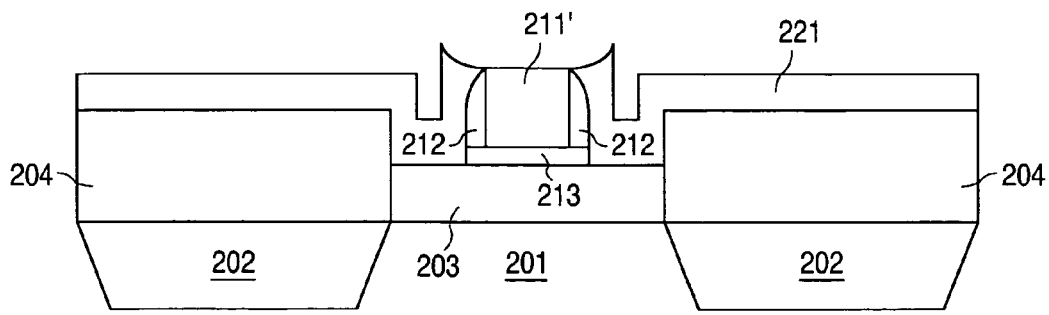
Figure 2G:
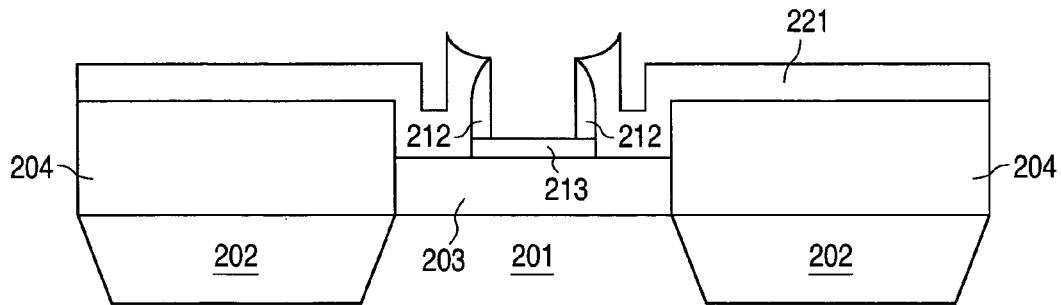
Figure 2H:
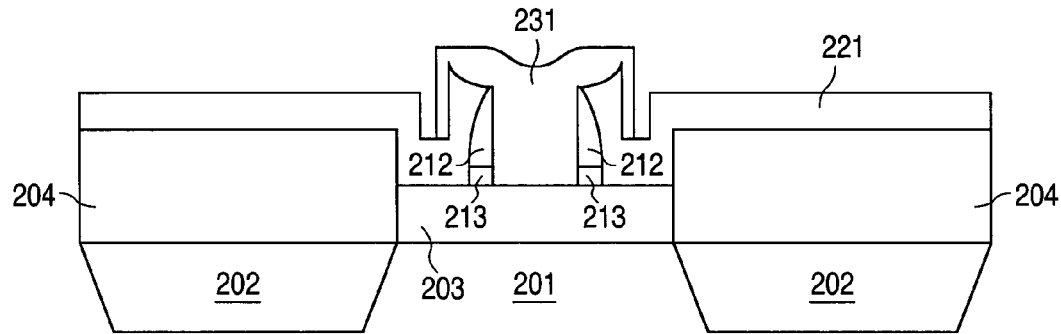
Figure 3A:
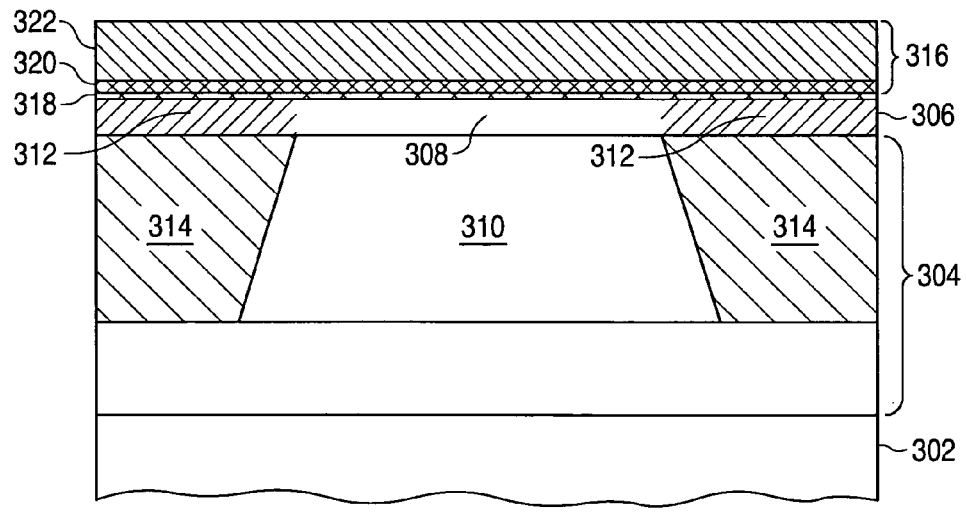
FIGS. 3A-3H are cross section drawings illustrating another prior art sequence of steps for fabricating a self-aligned bipolar transistor structure.
Figure 3B:
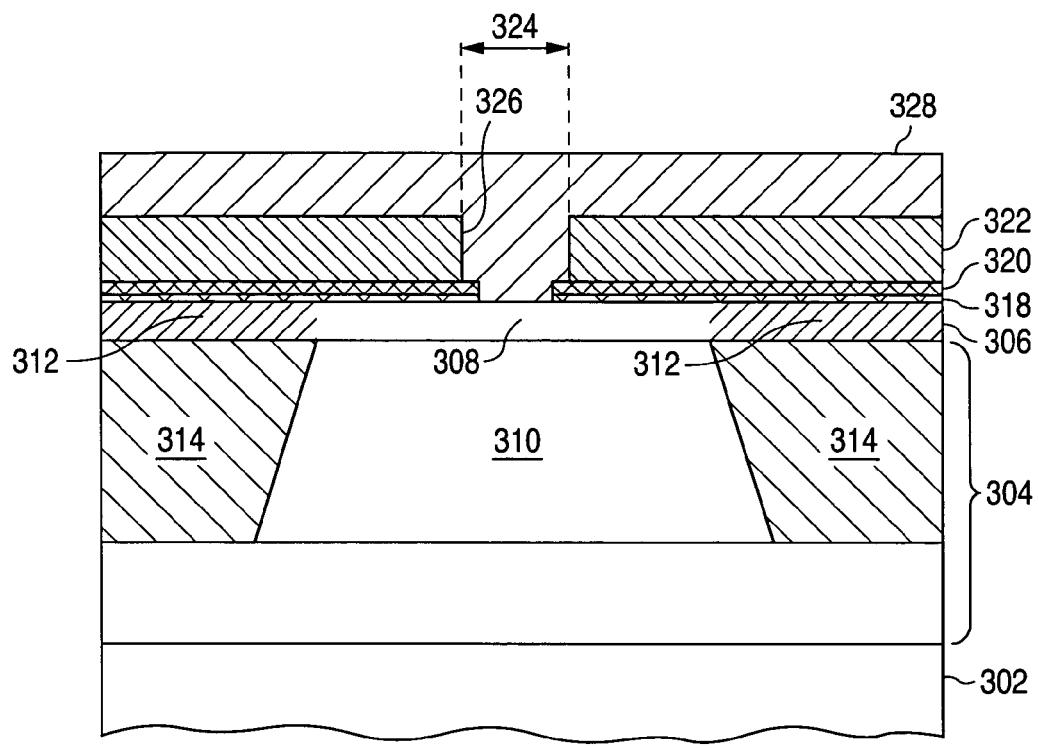
Figure 3C:
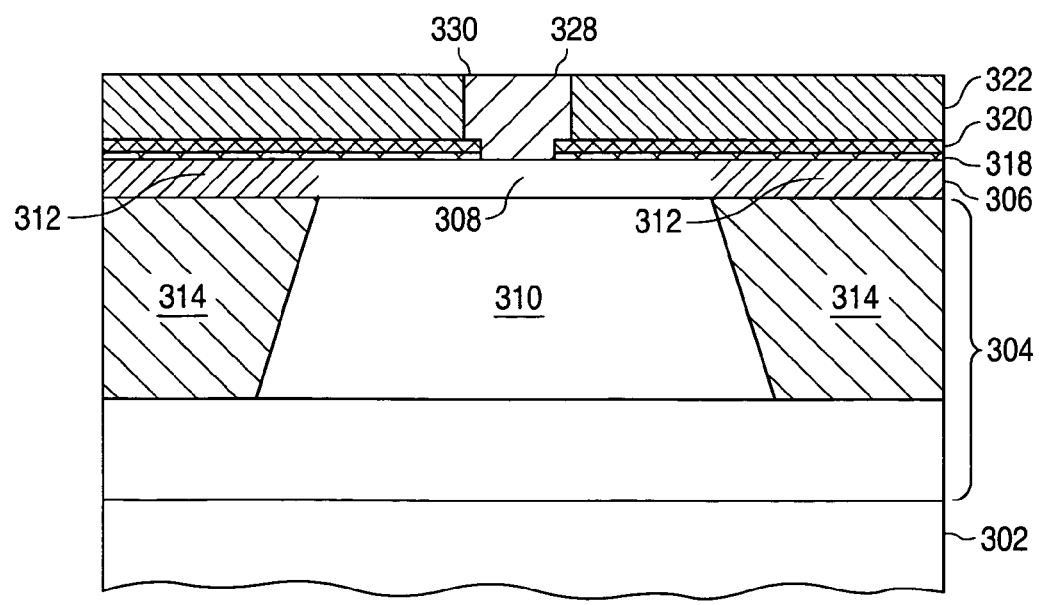
Figure 3D:
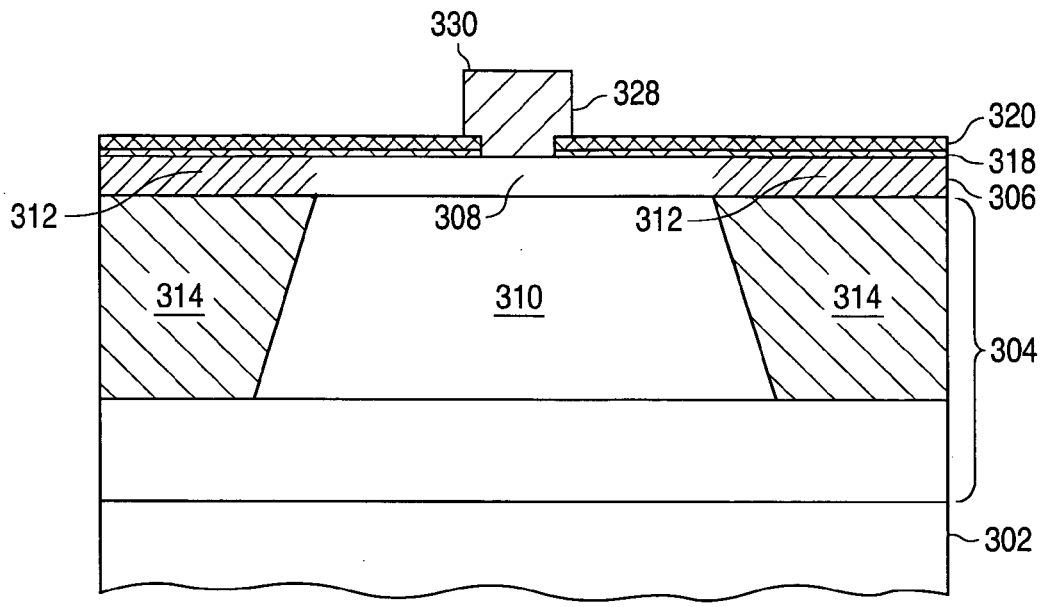
Figure 3E:
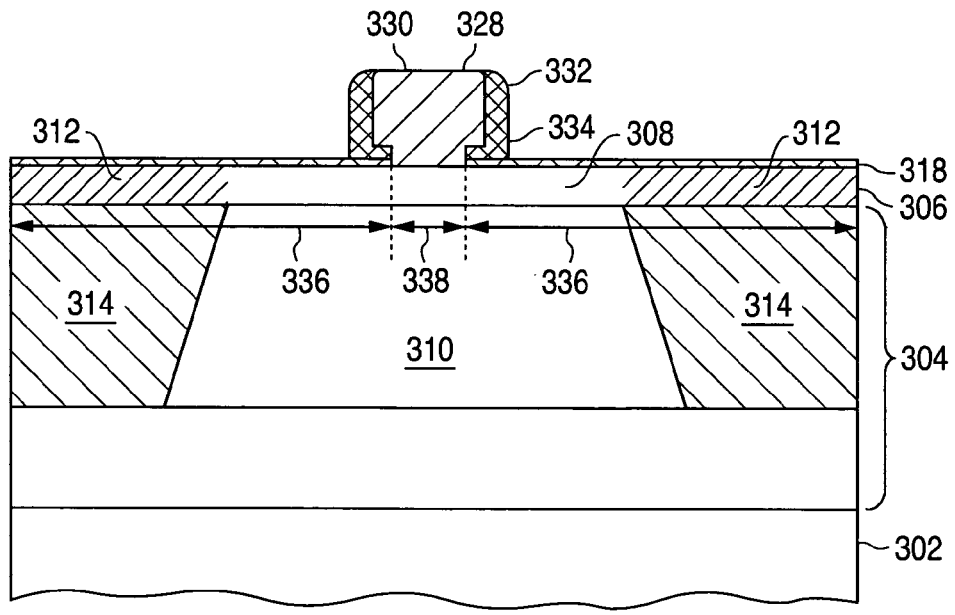
Figure 3F:
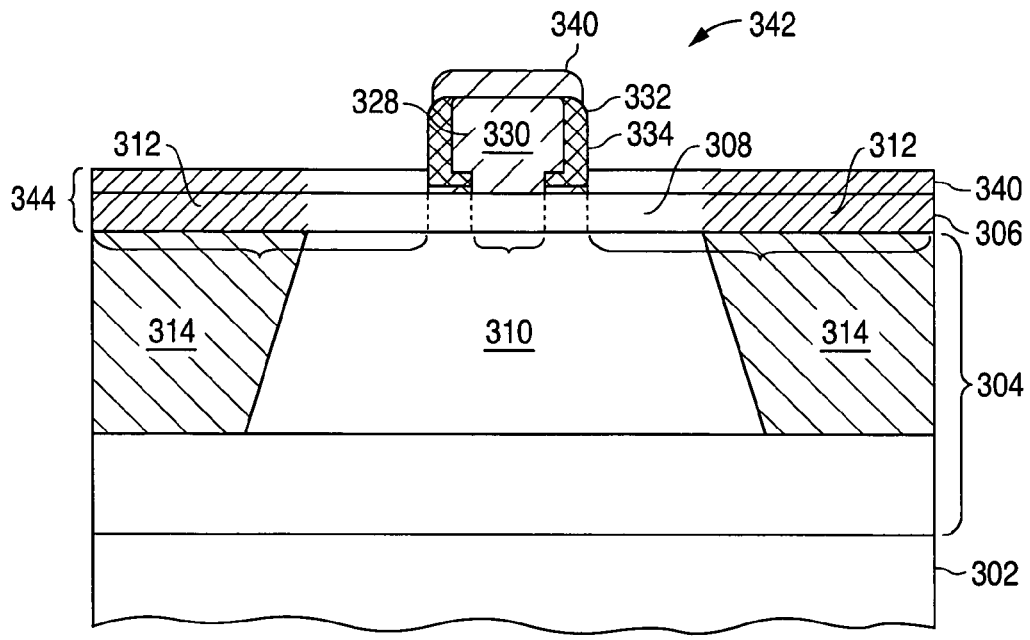
Figure 3G:
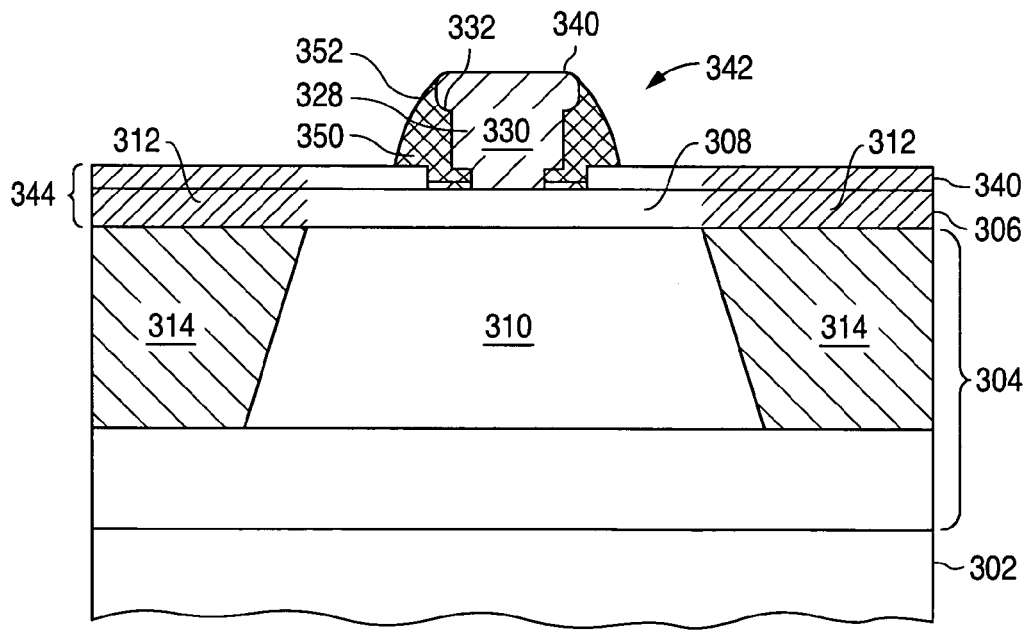
Figure 3H:
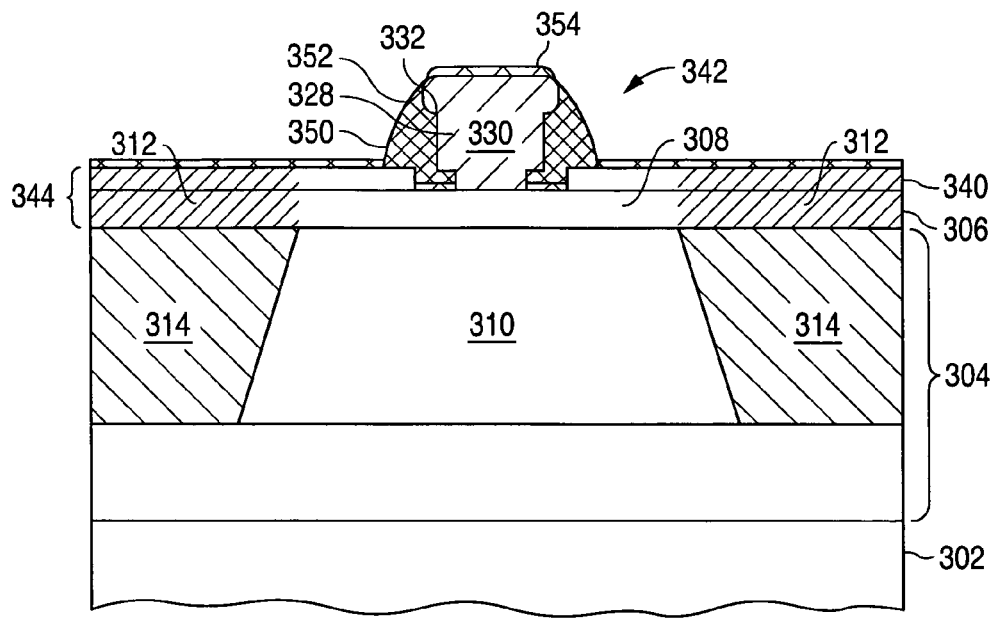
Figure 4A:
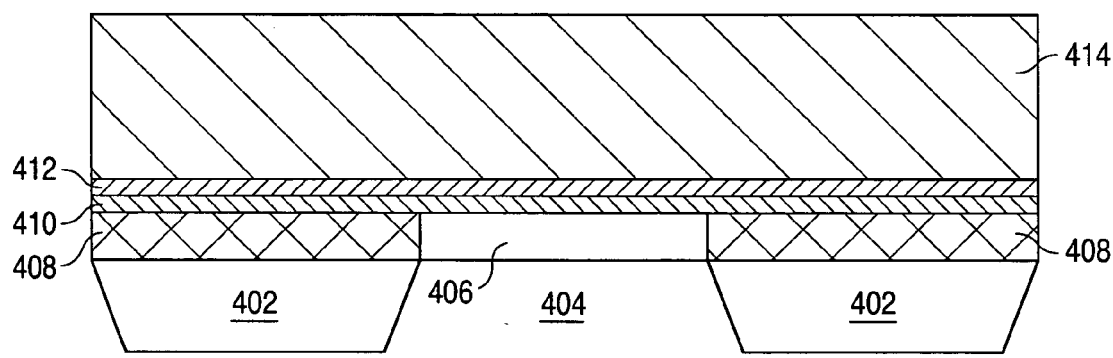
FIGS. 4A-4H are cross sectional drawings illustrating a sequence of steps for fabricating a self-aligned bipolar transistor structure in accordance with the concepts of the present invention.

FIG. 4A shows isolation regions 402, e.g. shallow trench isolation (STI) silicon dioxide, formed in amorphous semiconductor material 404, e.g. silicon. Base epitaxial material 406, which may be, for example, Si, SiGe or SiGe—C, is formed on the semiconductor material 404 and base polysilicon 408 is formed on the isolation regions 402. A thin layer of silicon oxide 410 approximately 20 nm thick is formed over the base poly 408 and the base SiGe—C material 406. A thin layer of silicon nitride 412, also approximately 20 nm thick, is formed on the thin oxide layer 410. A top oxide layer 414 approximately 250-500 nm thick is formed on the nitride layer 412, resulting in an oxide-nitride-oxide (ONO) dielectric layer. Those skilled in the art will appreciate that the foregoing structure can be fabricated utilizing process techniques well known in the semiconductor industry.

Figure 4B:
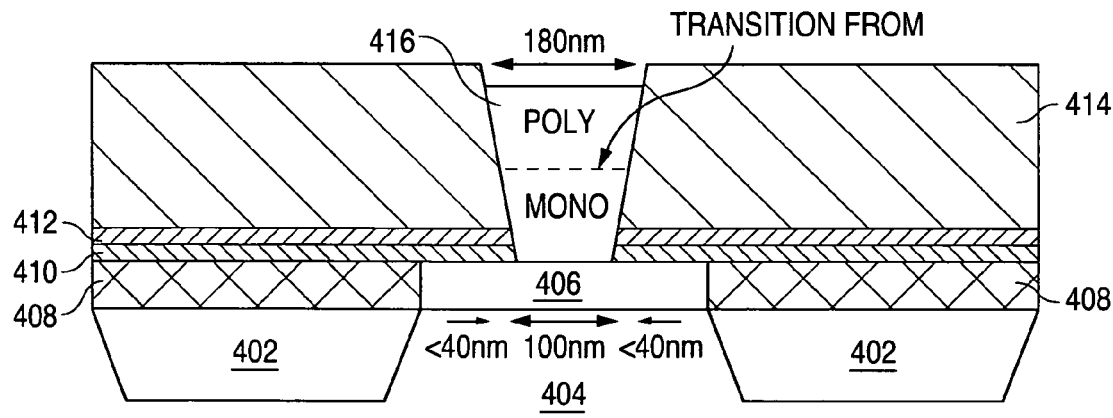

Referring to FIG. 4B, a sloped etch of the ONO layer is then performed to expose a portion of the upper surface of the base epi layer 406. The sloped emitter (ONO) etch allows a minimum emitter width that is well below lithographic capabilities. The amount of slope in the etch is not critical and is set only by the limits of the lithography. In the embodiment of the invention shown in FIG. 4B, the lithographic etch window at the top of the oxide layer 414 can be as wide as 180 nm. The sloped etch can result in exposure of an emitter opening on the surface of the base epi material 406 that is as narrow as 100 nm wide. The thickness of the nitride needs to be sufficient to support the sloped overetch of the top oxide layer 414.

As further shown in FIG. 4B, in accordance with the invention, an in-situ doped monosilicon/polysilicon ("mono/poly") emitter 416 is then formed in a chemical vapor deposition (CVD) process performed using an epi reactor, either through selective or non-selective silicon deposition. This is followed by chemical mechanical polishing (CMP) and/or an etch back step. The transition depth in the emitter 416 from monosilicon to polysilicon is selective based upon desired device characteristics. The thickness (or recess) of poly emitter 416 is also adjustable as a trade-off between emitter resistance and other NPN device characteristics.

Figure 4C:
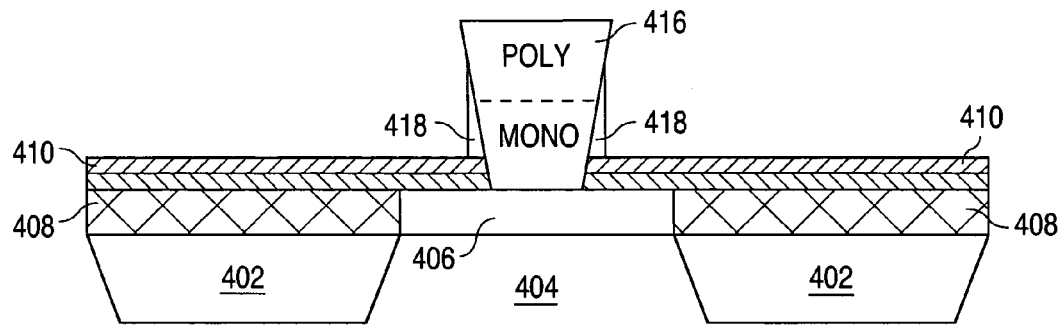

Next, as shown in FIG. 4C, a sacrificial oxide etch is performed to remove the top oxide layer 414. An anisotropic etch of the oxide layer 414 can produce sidewall oxide wedges 418. These wedges, while typically not problematic, can be removed by a wet etch or through the use of an isotropic etch. Alternatively, as discussed in detail below, the oxide wedges 418 can serve as spacers to provide the extrinsic base implant offset.

Figure 4D:
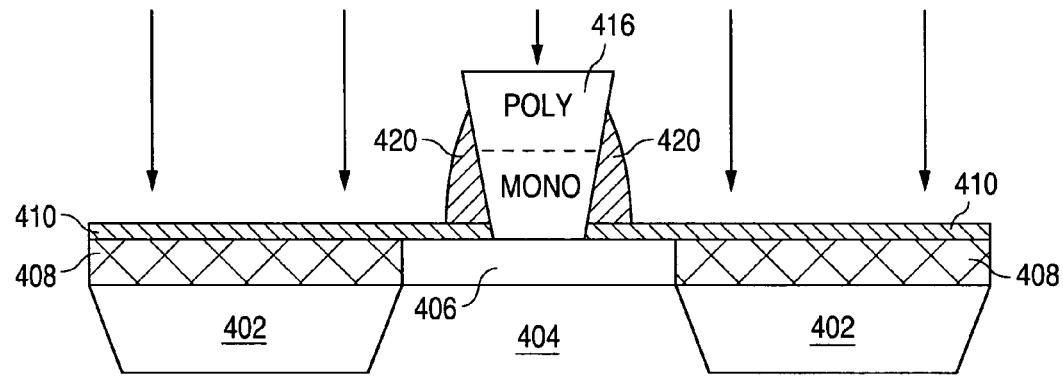
Figure 4E:
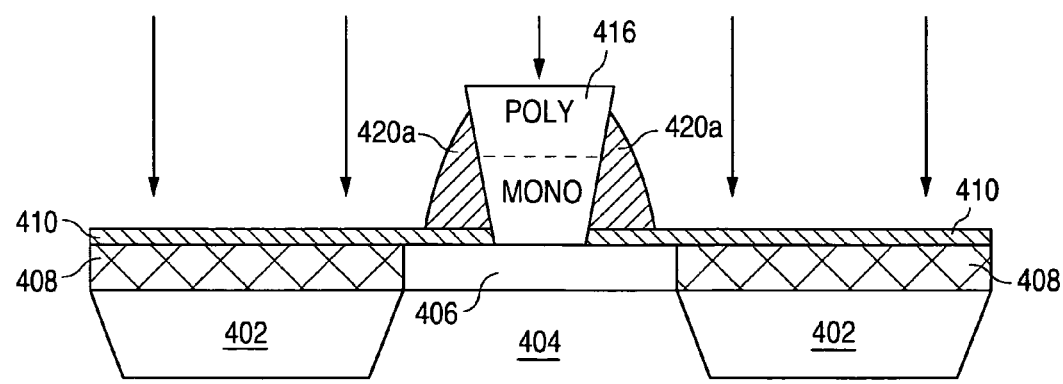
Figure 4F:
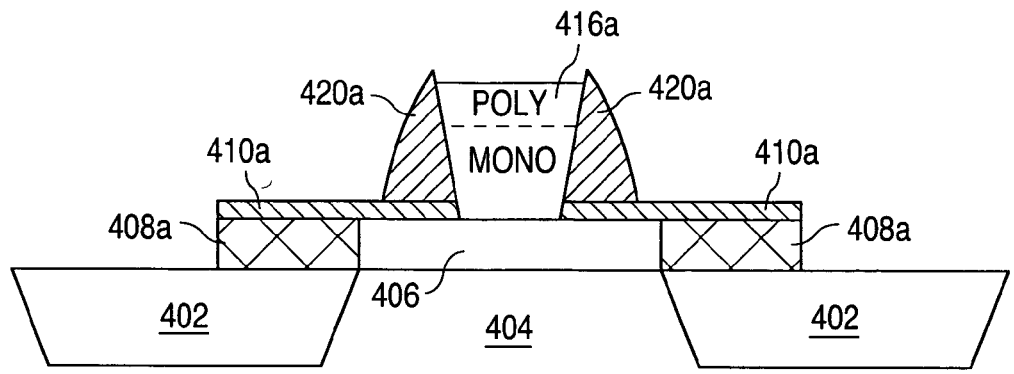
Figure 4G:
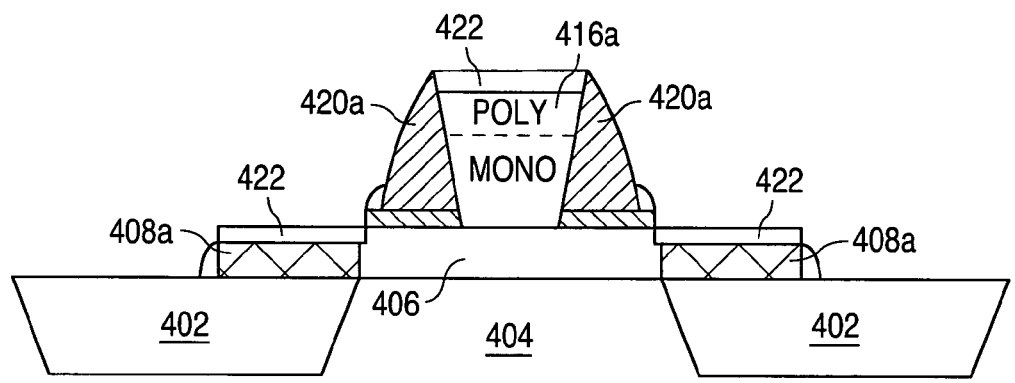

The next step in the process flow is the extrinsic base implant. Referring to FIGS. 4D-4F, in a first approach, the extrinsic base implant is divided into two steps: a first lightly doped extrinsic base (LDEB) implant that is offset from the emitter 416 using narrow nitride spacers and a second extrinsic base (EB) implant that uses a heavier dose and higher energy and is offset from the emitter 416 using wider nitride spacers than those used in the LDEB implant. As shown in FIG. 4D, the "narrow" nitride spacers 420 are formed by forming and etching back a layer of silicon nitride. The LDEB implant is then performed, with no mask and using the nitride spacers 420 in a self-aligned implant, typically boron at $1E13/cm^2$ to $2E14/cm^2$. Next, as shown in FIG. 4E, another nitride layer is formed and etched back to provide the "wide" nitride spacers 420a. The EB implant is then performed, again with no mask and self-aligned to the wide nitride spacers 420a, typically boron at 1E14/cm$^2$ to 2E15/cm$^2$. The wide spacers 420a also serve as a contact etch stop (self-aligned contacts) for very narrow emitters. A thin layer (10-50 nm) of heavily P+ doped material on the top of the emitter 416 (resulting from the LDEB and EB implants) is then removed through a simple silicon etch prior to emitter rapid thermal anneal (RTA), providing the emitter structure 416a shown in FIG. 4F. Those skilled in the art will appreciate that the amount of silicon etch, or final thickness of emitter 416a, is a trade-off between reducing the emitter resistance and other NPN characteristics. Those skilled in the art will also appreciate that the thickness of the bottom oxide layer 410 needs to support the nitride spacer overetch and the breakthrough oxide etch to remove the P+ implanted poly from the top of the emitter 416. The base is then defined using a conventional pattern and etch sequence to arrive at the structure shown in FIG. 4F. The remaining bottom oxide 410a is then removed and conventional techniques well known in the art are used to form salicide 422 on the extrinsic base regions 408a and on the emitter 416a, as shown in FIG. 4G.

Figure 4H:
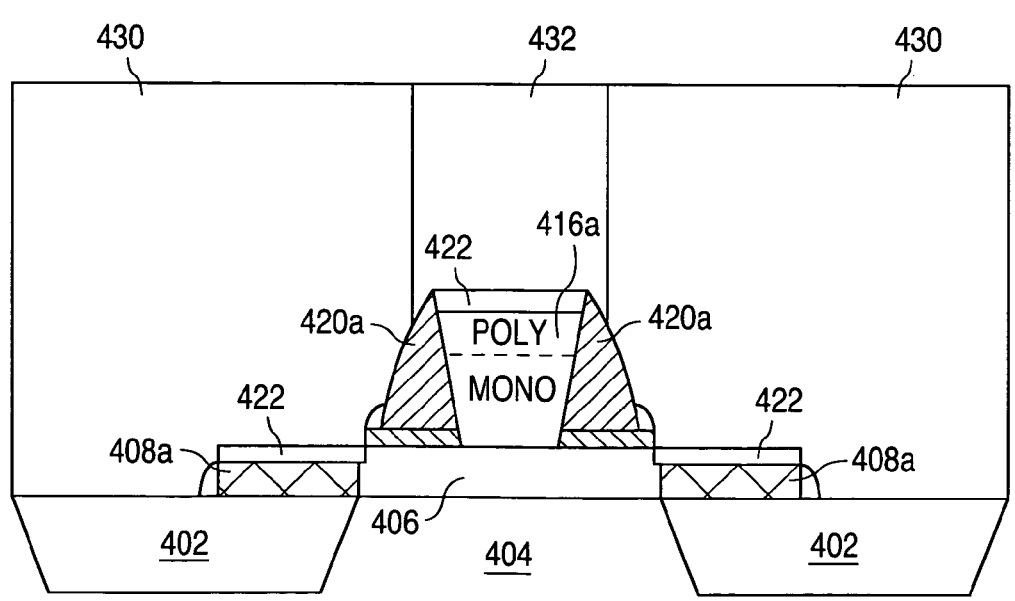

As shown in FIG. 4H, a thick oxide layer 430 is then formed and a via opening created for the formation of a tungsten plug 432 as the electrical contact to the salicided emitter 422/416a. As shown in FIG. 4H, the size of the tungsten plug 432 may overlap the emitter width to some extent.

FIGS. 5A-5I show a sequence of steps for fabricating a self-aligned bipolar transistor structure in accordance with an alternate embodiment of the present invention.

Figure 5A:
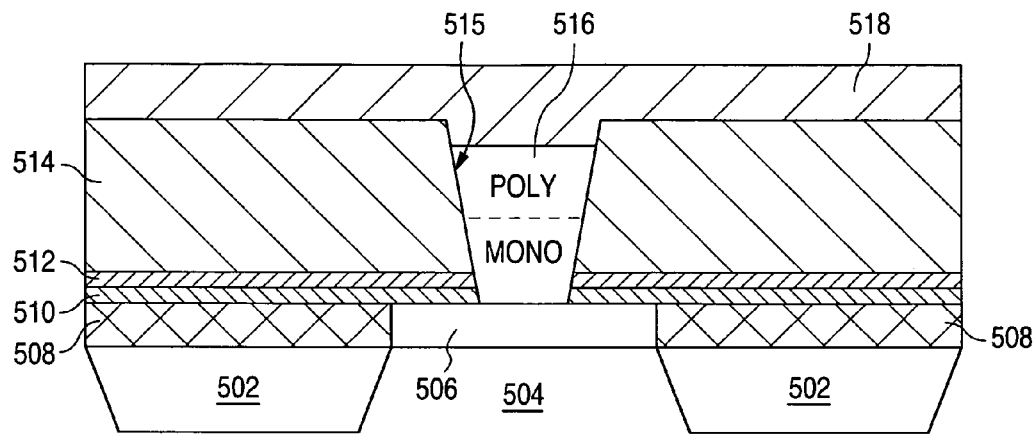
FIGS. 5A-5I are cross section drawings illustrating an alternate sequence of steps for fabricating a self-aligned bipolar transistor structure in accordance with the concepts of the present invention.
Figure 5B:
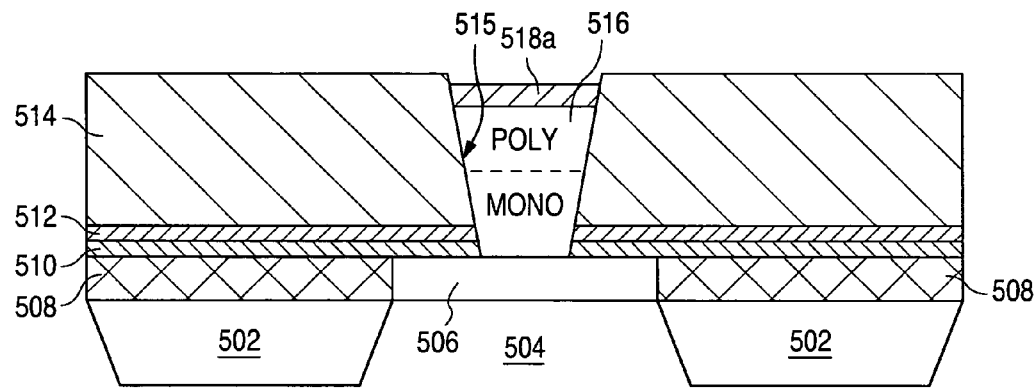

With reference to FIG. 5A, this alternate fabrication method begins with the same steps as the method described above in conjunction with FIGS. 4A and 4B. That is, isolation regions 502 (e.g. STI) are formed in semiconductor material 504. Base epitaxial material 506 is formed on the semiconductor material 504 and base poly 508 is formed on isolation regions 502. An ONO stack that includes thin oxide layer 510, nitride layer 512 and thick, top oxide layer 514 is the formed and a sloped etch step is performed to open a sloped emitter window 515 in the ONO stack to expose a surface region of the epi material 506. An in-situ doped monocrsytalline/polycrystalline emitter plug 516 is then formed in the emitter window 515. In accordance with this alternate embodiment of the invention, a silicon nitride layer 518 is then formed over the structure that results from the foregoing steps, resulting in the structure shown in FIG. 5A.

A standard etch back or chemical mechanical polishing step is then performed to remove nitride from the top surface of the thick oxide 514, leaving a nitride plug 518a in the emitter window 515 on top of the mono/poly emitter plug 516. As discussed further below, the nitride plug 518a must be thick enough to withstand the subsequent formation of a first set of nitride spacers and yet thin enough to be removed during the formation of a second set of nitride spacers.

Figure 5C:
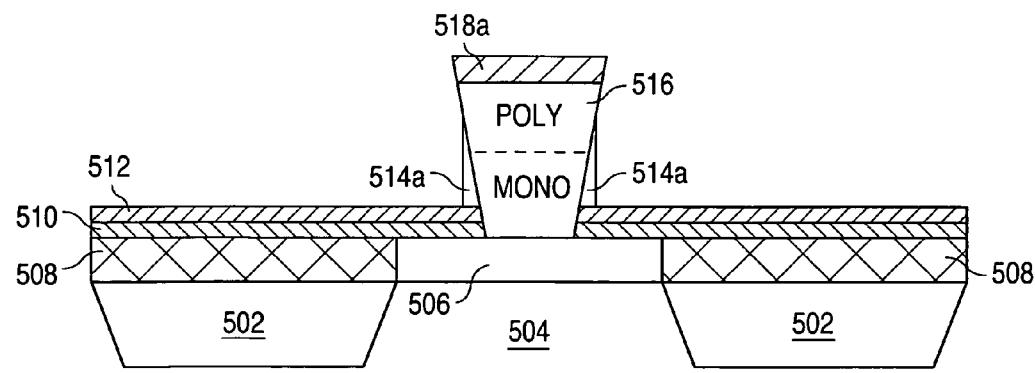

Next, as shown in FIG. 5C, the thick oxide layer 514 is etched back stopping on the nitride layer 512. As in the embodiment discussed above, removal of the top oxide layer 512 may result in oxide wedges 514a remaining on the sidewalls of the emitter plug 516, which may be allowed to remain or be removed by etching.

Figure 5D:
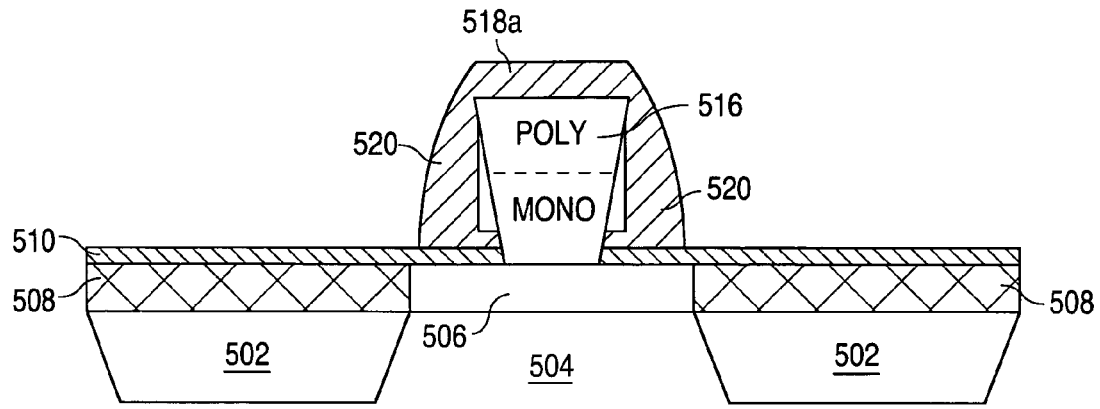

As shown in FIG. 5D, the mono/poly emitter 516 is then encapsulated in silicon nitride by forming a layer of nitride over the FIG. 5C structure and etching it back to form narrow (50-100 nm) spacers 520 on the sidewalls of the emitter plug 516 while at least a portion of the nitride plug 518a remains on top of the emitter plug 516; nitride layer 512 is removed from thin oxide 510 in the etch back step.

Figure 5E:
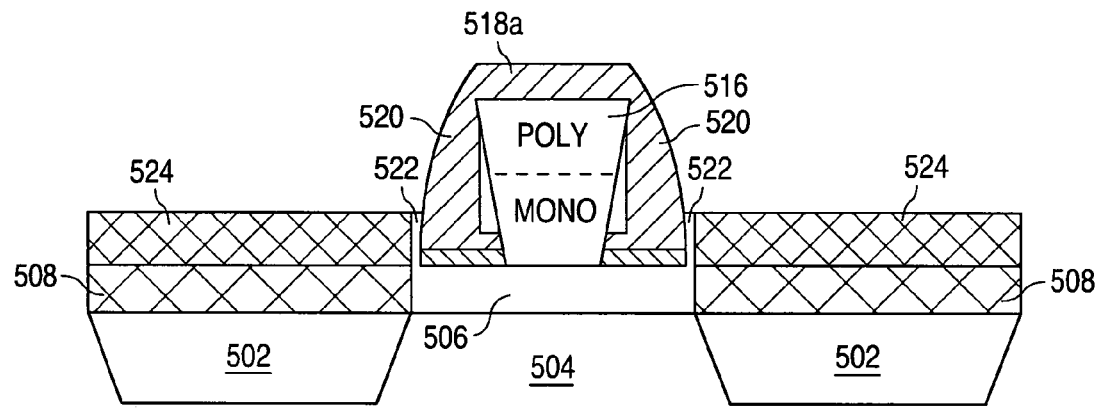
Figure 5F:
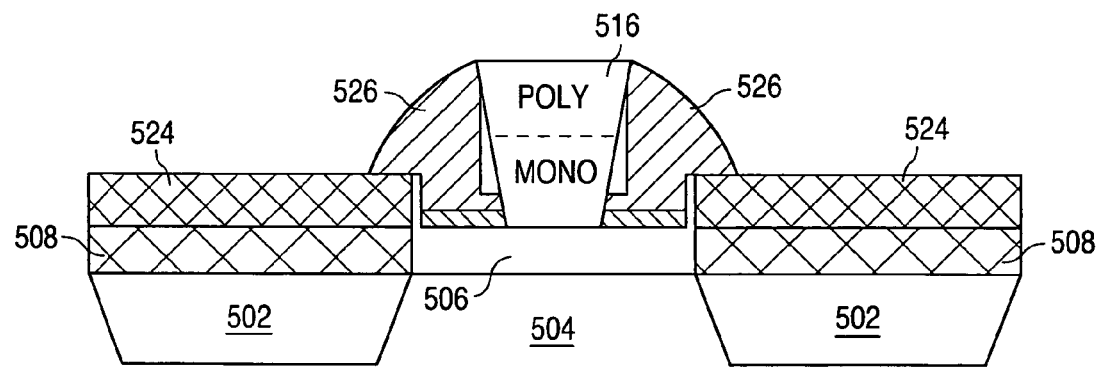

Referring to FIG. 5E, exposed portions of the thin oxide layer 510 are then removed by conventional techniques. An in-situ P+ doped raised extrinsic base is then formed over the poly base region 508 and exposed portions of the epi base region 506. As shown in FIG. 5E, the formation of the raised extrinsic base material results in monocrystalline silicon 522 being formed on exposed portions of the epi base 506 and P+ doped polysilicon 524 being formed on the poly base regions 508. P+ dopant from the raised extrinsic base poly regions 524 is then driven into the underlying epi base regions 506 in a rapid thermal anneal (RTA) step).

Next, a silicon nitride layer is formed over the FIG. 5E structure and etched back to form "wide" (<100 nm) nitride spacers 526 and to remove the remainder of the nitride plug 518a from the top of the emitter plug 516.

Figure 5G:
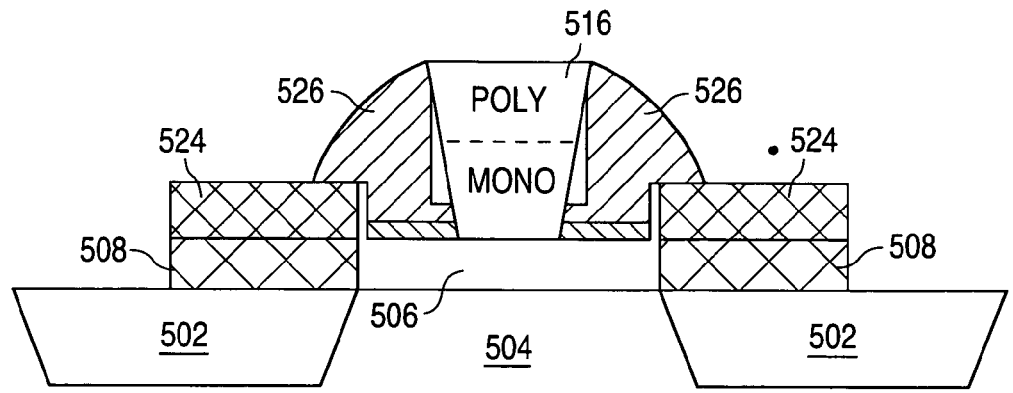
Figure 5H:
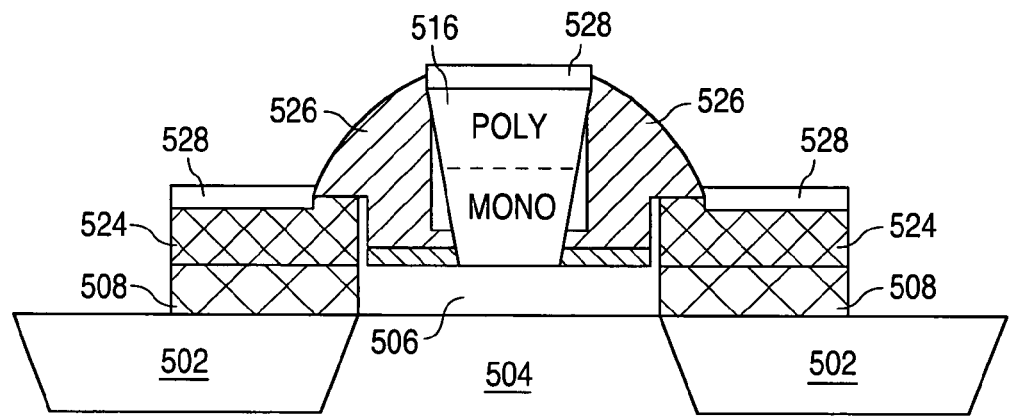
Figure 5I:
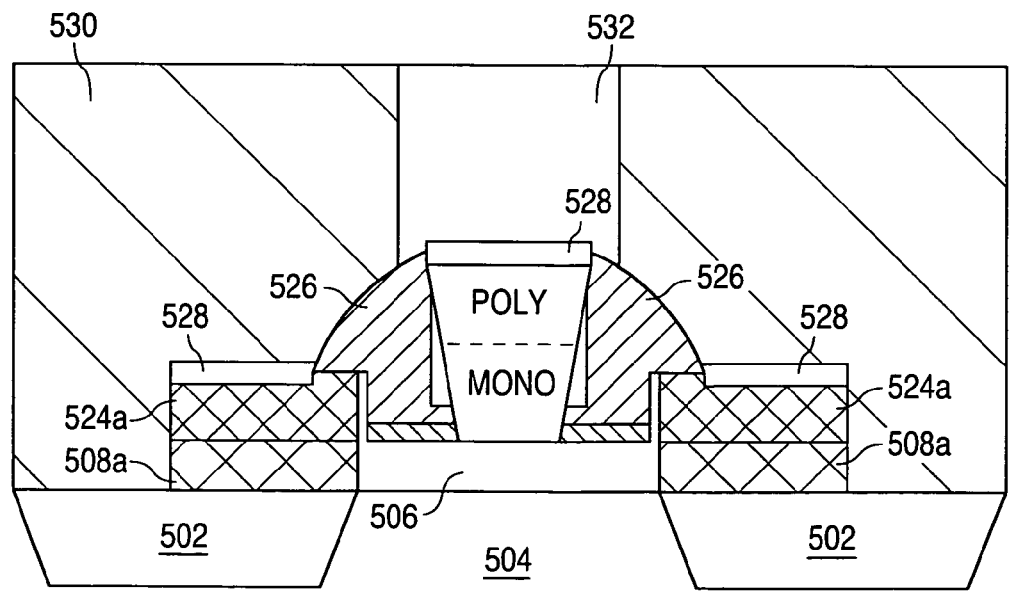

The extrinsic base layers 508 and 524 are then patterned and etched to form extrinsic base regions 508a and 524a, a shown in FIG. 5G. Silicide layers 528 are then formed on the surface of the extrinsic base regions 508/524a and on the top of the emitter plug 516 in the conventional manner, as shown in FIG. 5H. Finally, a layer of dielectric material 530 (e.g., silicon dioxide, is formed and patterned to allow formation of a conductive plug contact 532 (e.g., tungsten) to the top surface of the emitter plug 516. FIG. 5I shows an overlapping emitter contact plug 532.

FIGS. 6A-6I show a sequence of steps for fabricating a self-aligned bipolar transistor structure in accordance with another alternate embodiment of the present invention. A standard process with a non-selectively grown SiGe base is used to illustrate this embodiment of the invention.

Figure 6A:
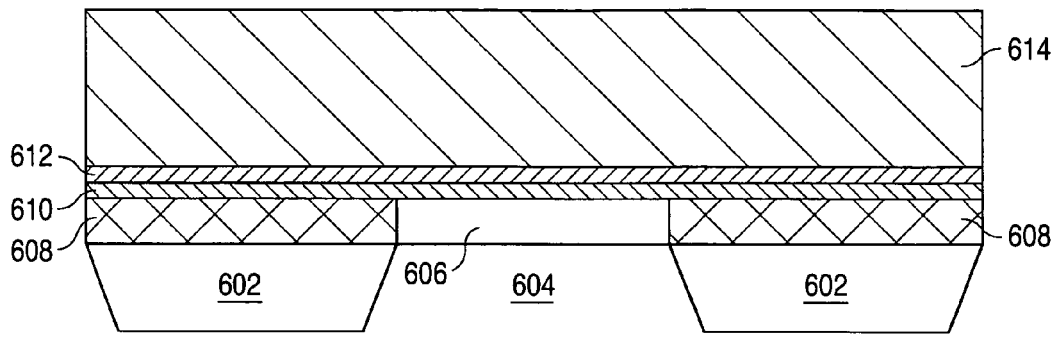
FIGS. 6A-6I are cross section drawings illustrating a second alternate sequence of steps for fabricating a self-aligned bipolar transistor structure in accordance with the concepts of the present invention.

This alternate process flow begins in the same manner as the flow described above in conjunction with FIGS. 4A-4H. That is, collector and base active regions are defined, with the SiGe base region being deposited using non-selective epitaxy. Next, as shown in FIG. 6A, isolation regions 602 are formed in a semiconductor substrate 604. Base SiGe:C epitaxial layer 606 is formed on the substrate 604 and base polysilicon 608 is formed on isolation regions 602. An ONO stack that includes a thin oxide layer 610 (20-30 nm), a silicon nitride layer 612 (20-30 nm) and a thick top oxide layer 614 (0.4-0.5 um) is deposited over the base poly 608 and the SiGe:C material 606.

Figure 6B:
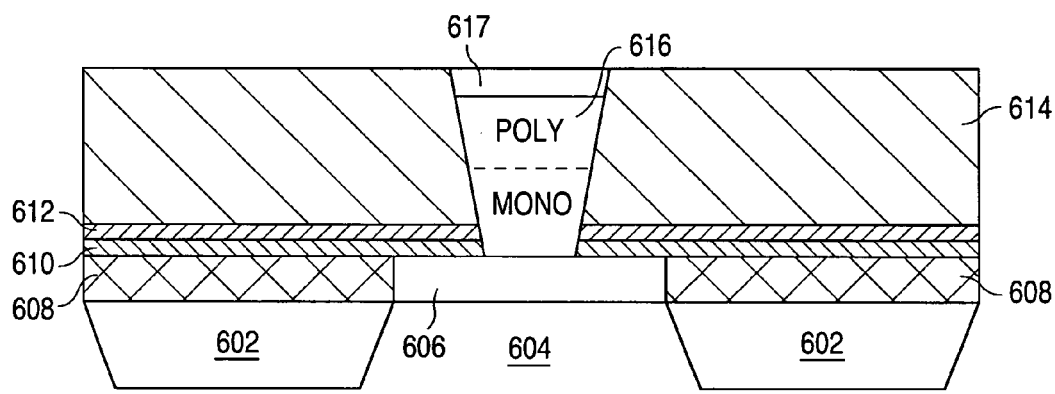

Referring to FIG. 6B, a sloped emitter window is then defined and filled with mono/poly silicon 616 with an appropriate doping level and thickness, as discussed above. As discussed above, the transition from mono to poly in the emitter 616 is adjustable. This is followed by the formation of a poly SiGe plug 617 with a Ge mole fraction between about 20-40%, and with a sufficient thickness to act as a protective layer, typically 5-50 nm and preferably about 15 nm thick.

Figure 6C:
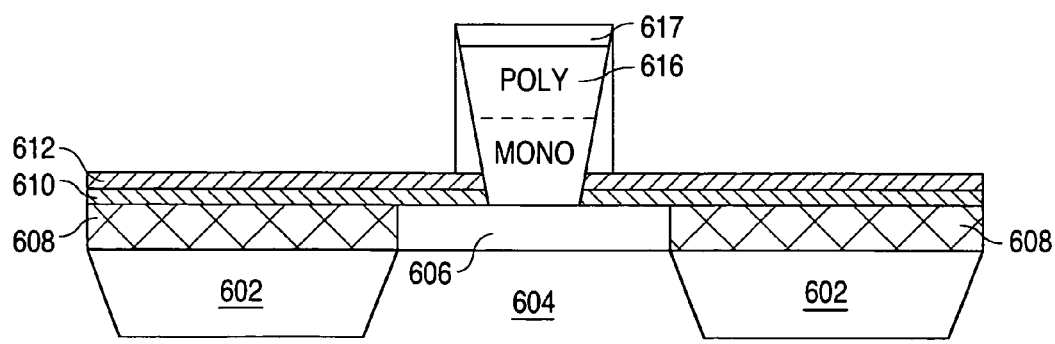

As shown in FIG. 6C, the top oxide layer 614 is then etched back, stopping on the nitride layer 612 and using the emitter structure 616/617 as a hard mask. As shown in FIG. 6C, and as discussed above, some of the top oxide 614 may remain on the sidewalls of the emitter structure after the etch back and become part of the sidewall nitride spacers, or it can be removed prior to nitride spacer formation.

Figure 6D:
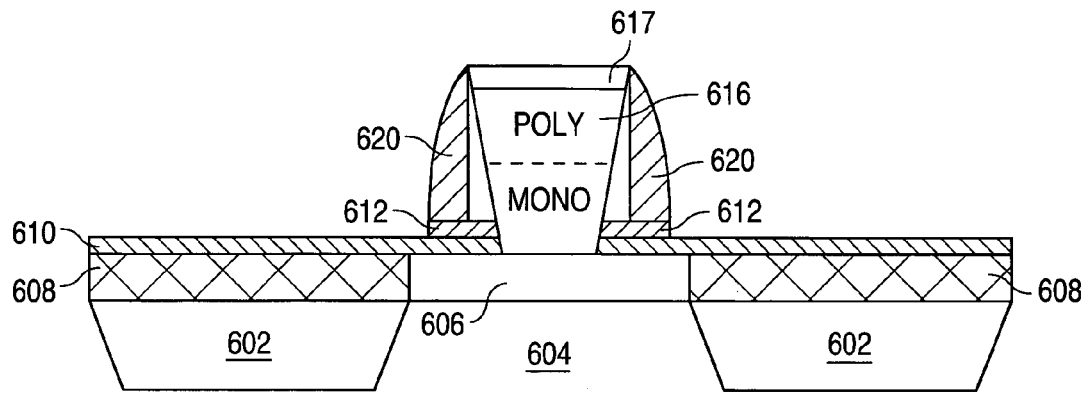
Figure 6E:
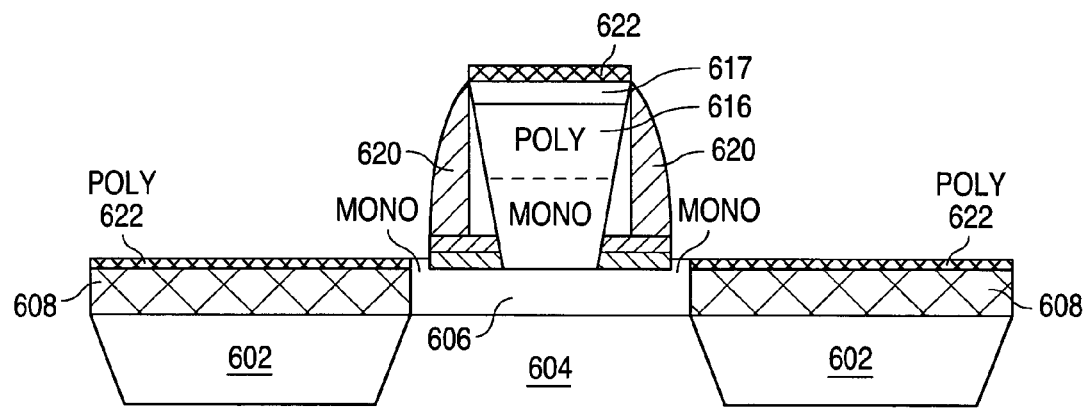

Referring to FIG. 6D, a silicon nitride layer approximately 0.1-0.2 um thick is then deposited and etched back to form sidewall spacers 620. A nitride overetch removes the exposed portions of the thin nitride layer 612. Next, as shown in FIG. 6E, the thin oxide layer 610 is dipped off and an in-situ doped polysilicon layer 622, with high dopant concentration of the conductivity type opposite that of the emitter 616, is selectively grown. As further shown in FIG. 6E, the in-situ doped poly step results in the formation of monocrystalline (mono) silicon on the exposed portions of the monocrystalline epi 606 and in the formation of polycrystalline silicon on the exposed portions of the polycrystalline epi 608. As those skilled in the art will appreciate, the in-situ doped poly 622 acts as a diffusion source for the extrinsic base region 608; it remains on top of the sacrificial SiGe layer 617 on the emitter 616.

Figure 6F:
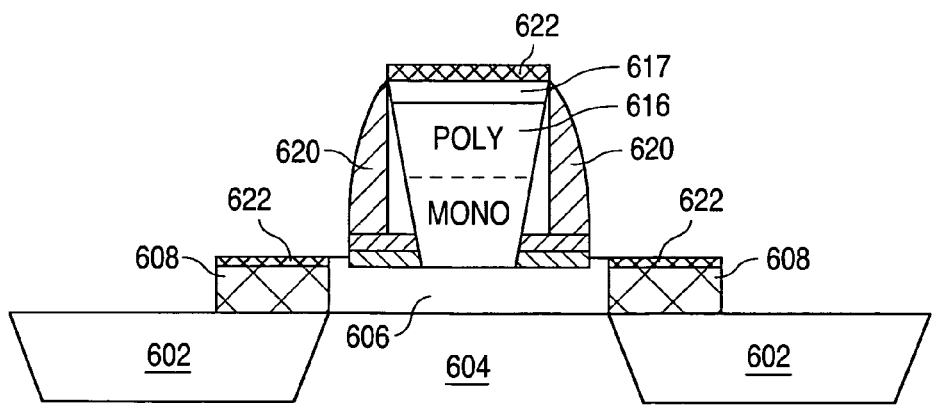
Figure 6G:
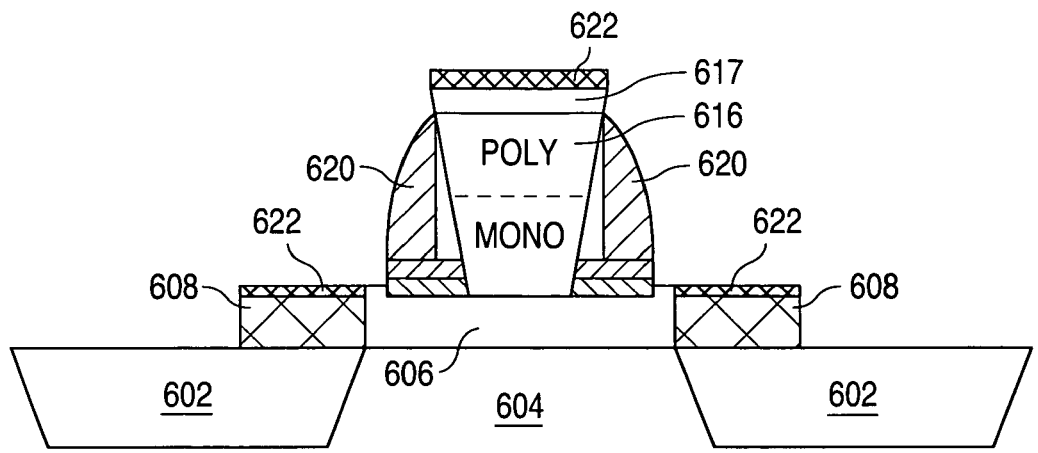
Figure 6H:
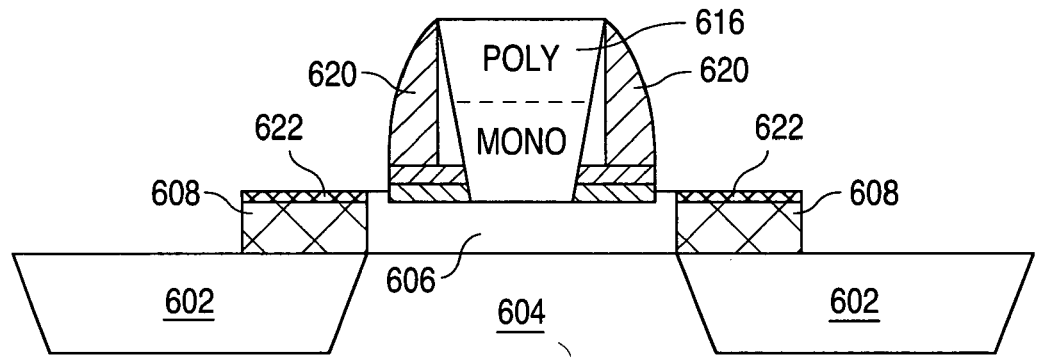
Figure 6I:
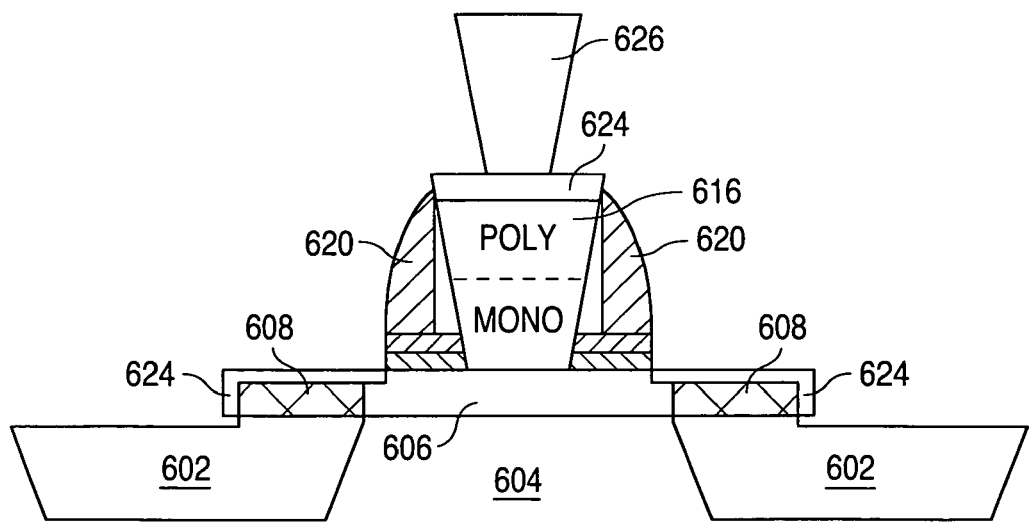

FIG. 6F shows extrinsic base definition and etch in the conventional manner. Next, as shown in FIG. 6G, the nitride spacer is partially recessed and the residual oxide spacer is wet etched to expose the perimeter of the Ge-rich layer 617 on top of the emitter 616. A selective wet or dry etch step is then performed to remove the sacrificial Ge-rich layer 617, resulting in the structure shown in FIG. 6H. The top-most layer of poly 622 is then lifted off of the doped epi regions 608; due to the high selectivity of the lift-off, other silicon and polysilicon layers are not affected. An anneal then drives dopant from the doped emitter 616 into the monocrystalline epi layer 606, base and emitter silicide 624 are formed, and conductive emitter contact plug, e.g. tungsten 626, is formed, all in the conventional manner, resulting in the structure shown in FIG. 6I. Of course, those skilled in the art will appreciate that the emitter contact 626 can be of the overlapping type shown in FIGS. 4H and 5I and discussed above.

Those skilled in the art will appreciate that the foregoing techniques provide a number of advantages over prior art self-aligned processes for BiCMOS devices. In addition to the elimination of all sacrificial polysilicon layers, the mask, chemical deposition and etching steps associated with a polysilicon emitter layer are also eliminated by use of the emitter plug. The extrinsic base implant no longer requires a mask. Unlike, prior art self-aligned processes, the ONO stack is formed on top of the base polysilicon; this provides more latitude in etching an residues associated with the ONO layers. Like prior self-aligned processes, an emitter width that is below lithographic capabilities is achieved through the use of the sloped emitter window etch, which also means that the emitter width doe not have to be fixed (i.e., subject to lithographic constraints). Reduced emitter fringe capacitance also enhances RF performance, particularly for low power applications.

It should be recognized that a number of variations of the above-disclosed embodiments of the invention will be obvious to one of ordinary skill in the art in view of the foregoing description. Accordingly, the present invention is not to be limited by those specific embodiments shown and described herein. Rather, the scope of the invention is to be defined by the following claims and their equivalents.

What is claimed is:

1. A method of forming a bipolar transistor structure in a semiconductor substrate having a first conductivity type, the bipolar transistor structure including a collector region having a second conductivity type that is opposite the first conductivity type and that is formed in a substrate active device region defined by isolation dielectric material formed in an upper surface of the semiconductor substrate, the bipolar transistor structure further including an epitaxial layer having a monocrystalline portion formed over the collector region and a polycrystalline portion formed over the isolation dielectric material, the method comprising:

forming a dielectric layer over the epitaxial layer;

forming a patterned mask over the dielectric layer, the patterned mask having a mask opening formed therein to expose an upper surface area of the dielectric layer, the upper surface area having a first width;

performing an etch step utilizing the mask opening to define a sloped emitter window in the dielectric layer to expose an emitter surface area of the monocrystalline portion of the epitaxial layer such that the emitter surface area has a second width that is less than the first width;

forming in-situ doped emitter material having the second conductivity type in the sloped emitter window;

exposing the emitter material;

forming dielectric spacer material on sidewalls of the emitter material to provide an emitter structure; and utilizing the emitter structure to introduce dopant having the first conductivity type into portions of the epitaxial layer.

2. A method of forming a bipolar transistor structure in a semiconductor substrate having a first conductivity type, the bipolar transistor structure including a collector region having a second conductivity type that is opposite the first conductivity type and that is formed in a substrate active device region defined by isolation dielectric material formed in an upper surface of the semiconductor substrate, the bipolar transistor structure further including an epitaxial layer having the first conductivity type, the epitaxial layer including a monocrystalline portion formed over the collector region and a polycrystalline portion formed over the isolation dielectric, the method comprising:

forming an oxide-nitride-oxide (ONO) stack that includes a thin silicon oxide layer formed over the epitaxial layer, a silicon nitride layer formed over the thin silicon oxide layer, and a thick top silicon oxide layer formed over the silicon nitride layer;

forming a patterned mask over the thick top silicon oxide layer, the patterned mask having a mask opening formed therein to expose an upper surface area of the thick top silicon oxide layer, the upper surface area having a first width;

performing an etch step utilizing the mask opening to define a sloped emitter window in the ONO stack to expose an emitter surface area of the monocrystalline portion of the epitaxial layer such that the emitter surface area has a second width that is less than the first width;

forming in-situ doped emitter material having the second conductivity type in the sloped emitter window;

removing the thick top oxide layer to expose the in-situ doped emitter material;

forming a first sidewall silicon nitride layer over the structure resulting from the foregoing steps;

patterning the first sidewall silicon nitride layer and underlying silicon nitride layer to expose first surface portions of the thin silicon oxide layer and to define first silicon nitride spacers on sidewalls of the in-situ doped emitter material, the first silicon nitride spacers having a first spacer width;

performing a first implant step to implant dopant having the first conductivity type through the exposed first surface portions of the thin silicon oxide layer and into underlying polycrystalline portions of the epitaxial layer;

forming a second sidewall silicon nitride layer over the structure resulting from the foregoing steps;

patterning the second sidewall silicon nitride layer to expose second surface portions of the thin silicon oxide layer and to define second silicon nitride spacers on sidewalls of the in-situ doped emitter material, the second silicon nitride spacers having a second spacer width that is greater than the first spacer width;

performing a second implant step to implant dopant having the first conductivity type through the exposed second surface portions of the thin oxide layer and into underlying polycrystalline portions of the epitaxial layer;

defining extrinsic base regions from the polysilicon portions of the epitaxial layer;

removing thin silicon oxide from the extrinsic base regions;

forming silicide on the upper surface of the extrinsic base regions and on the upper surface of the in-situ doped emitter material; and forming a conductive contact to the silicide formed on the upper surface of the in-situ doped emitter material.

3. A method as in claim 2, and wherein the in-situ doped emitter material comprises a lower monocrystalline silicon portion formed on the emitter surface area of the monocrystalline portion of the epitaxial layer and an upper polycrystalline silicon portion formed on the lower monocrystalline silicon portion.

4. A method as in claim 2, and wherein the first width of the upper surface area of the thick top silicon oxide layer is about 180 nm or less and the second width of the emitter surface area of the monocrystalline portion of the epitaxial layer is about 100-180 nm.

5. A method as in claim 2, and wherein the epitaxial layer is formed from material selected from the group consisting of Si, SiGe, SiGe—C and combinations thereof.

6. A method as in claim 2, and wherein the thin silicon oxide layer is about 20 nm thick, the silicon nitride layer is about 20 nm thick, and the thick top silicon oxide layer is about 250-500 nm thick.

7. A method of forming a bipolar transistor structure in a semiconductor substrate having a first conductivity type, the bipolar transistor structure including a collector region having a second conductivity type that is opposite the first conductivity type and that is formed in a substrate active device region defined by isolation dielectric material formed in an upper surface of the semiconductor substrate, the bipolar transistor structure further including an epitaxial layer having the first conductivity type, the epitaxial layer including a monocrystalline portion formed over the collector region and a polycrystalline portion formed over the isolation dielectric material, the method comprising:

forming an oxide-nitride-oxide (ONO) stack that includes a thin silicon oxide layer formed over the epitaxial layer, a silicon nitride layer formed over the thin silicon oxide layer, and a thick top silicon oxide layer formed over the silicon nitride layer;

forming a patterned mask over the thick top silicon oxide layer, the patterned mask having a mask opening formed therein to expose an upper surface area of the thick top silicon oxide layer, the upper surface area having a first width;

performing an etch step utilizing the mask opening to define a sloped emitter window in the ONO stack to expose an emitter surface area of the monocrystalline portion of the epitaxial layer such that the emitter surface area has a second width that is less than the first width;

forming in-situ doped emitter material having the second conductivity type in the sloped emitter window such that an upper surface of the in-situ doped emitter material is below an upper surface of the thick top silicon oxide layer;

forming a silicon nitride plug layer over the structure formed by the foregoing steps;

removing portions of the silicon nitride plug layer to expose the upper surface of the thick top silicon oxide layer and to define a silicon nitride surface plug in the sloped emitter window on a top surface of the in-situ dope emitter material;

removing the thick top silicon oxide layer to expose the in-situ doped emitter material and the silicon nitride surface plug;

forming a first sidewall silicon nitride layer over the structure resulting from the foregoing steps;

etching the first sidewall silicon nitride layer and underlying silicon nitride layer to expose surface portions of the thin silicon oxide layer and to define first silicon nitride spacers on sidewalls of the in-situ doped emitter material, the first silicon nitride spacers having a first spacer width, the first silicon nitride spacers being formed such that the first silicon nitride spacers in combination with the silicon nitride surface plug encapsulate the in-situ doped emitter material;

removing the exposed surface portions of the thin silicon oxide layer to expose the crystalline portions of the epitaxial layer;

forming an in-situ doped raised extrinsic base layer having the first conductivity type on the exposed crystalline portions of the epitaxial layer;

forming a second sidewall silicon nitride layer over the structure resulting from the foregoing steps;

etching the second sidewall silicon nitride layer to expose the raised extrinsic base layer and to define second silicon nitride spacers on sidewalls of the in-situ doped emitter structure while simultaneously removing the silicon nitride surface plug from the surface of the in-situ doped emitter material, the second silicon nitride spacers having a second spacer width that is greater than the first spacer width;

defining raised extrinsic base regions from the raised extrinsic base layer and the polysilicon portions of the epitaxial layer;

forming silicide on upper surfaces of the raised extrinsic base regions and on the upper surface of the in-situ doped emitter material; and forming a conductive contact to the silicide formed on the upper surface of the in-situ doped emitter material.

8. A method as in claim 7, and wherein the in-situ doped emitter material comprises a lower monocrystalline silicon portion formed on the emitter surface area of the monocrystalline portion of the epitaxial layer and an upper polycrystalline silicon portion formed on the lower monocrystalline silicon portion.

9. A method as in claim 7, and wherein the first width of the upper surface area of the thick top silicon oxide layer is about 180 nm or less and the second width of the emitter surface area of the monocrystalline portion of the epitaxial layer is about 100-180 nm.

10. A method as in claim 7, and wherein the epitaxial layer is formed from material selected from the group consisting of Si, SiGe, SiGe—C and combinations thereof.

11. A method as in claim 7, and wherein the thin silicon oxide layer is about 20 nm thick, the silicon nitride layer is about 20 nm thick, and the thick top silicon oxide layer is about 250-500 nm thick.

12. A method as in claim 7, and wherein the first spacer width is about 50-100 nm and the second spacer width is about 100 nm.

13. A method of forming a bipolar transistor structure in a semiconductor substrate having a first conductivity type, the bipolar transistor structure including a collector region having a second conductivity type that is opposite the first conductivity type and that is formed in a substrate active device region defined by isolation dielectric material formed in an upper surface of the semiconductor substrate, the bipolar transistor structure further including an epitaxial layer having the first conductivity type, the epitaxial layer including a monocrystalline portion formed over the collector region and a polycrystalline portion formed over the isolation dielectric material, the method comprising:

forming an oxide-nitride-oxide (ONO) stack that includes a thin silicon oxide layer formed over the epitaxial layer, a silicon nitride layer formed over the thin silicon oxide layer, and a thick top silicon oxide layer formed over the silicon nitride layer;

forming a patterned mask over the thick top silicon oxide layer, the patterned mask having a mask opening formed therein to expose an upper surface area of the thick top silicon oxide layer, the upper surface area having a first width;

performing an etch step utilizing the mask opening to define a sloped emitter window in the ONO stack to expose an emitter surface area of the monocrystalline portion of the epitaxial layer such that the emitter surface area has a second width that is less than the first width;

forming in-situ doped emitter material having the second conductivity type in the sloped emitter window such that an upper surface of the in-situ doped emitter material is below an upper surface of the thick top silicon oxide layer;

forming a SiGe plug in the sloped emitter window on the top surface of the in-situ doped emitter material;

removing the thick top silicon oxide layer to expose the in-situ doped emitter material and the SiGe plug;

forming a sidewall silicon nitride layer over the structure resulting from the foregoing steps;

patterning the sidewall silicon nitride layer and underlying silicon nitride layer to expose surface portions of the thin silicon oxide layer and to define silicon nitride spacers on sidewalls of the in-situ doped emitter material;

removing exposed portion of the thin silicon oxide layer to expose the polycrystalline portions of the epitaxial layer and portions of the monocrystalline portion of the epitaxial layer;

forming a layer of in-situ doped conductive material having the first conductivity type such that polycrystalline conductive material is formed on the exposed polycrystalline portions of the epitaxial layer, monocrystalline conductive material is formed on exposed monocrystalline portions of the epitaxial layer, and in-situ doped conductive material is formed on the top surface of the SiGe plug;

performing a thermal step to drive dopant having the first conductivity type from the polycrystalline conductive material into underlying polycrystalline portions of the epitaxial layer;

etching the polycrystalline conductive material and underlying polycrystalline portion of the epitaxial layer to expose upper surfaces of the dielectric isolation material and to define extrinsic base regions of the bipolar transistor structure;

removing the SiGe plug from the top surface of the in-situ doped emitter material;

removing polycrystalline conductive material from the polycrystalline portions of the epitaxial layer;

forming silicide on upper surfaces of the polycrystalline portions of the epitaxial layer and on the upper surface of the in-situ doped emitter material; and forming a conductive contact to the silicide formed on the upper surface of the in-situ doped emitter material.

14. A method as in claim 13, and wherein the SiGe plug comprises poly SiGe having a Ge mole fraction of about 20-40%.

15. A method as in claim 14, and wherein the SiGe plug is about 5-50 nm thick.

16. A method as in claim 14, and wherein the SiGe plug is about 15 nm thick.

17. A method as in claim 13, and wherein the in-situ doped emitter material comprises a lower monocrystalline silicon portion formed on the emitter surface area of the monocrystalline portion of the epitaxial layer and an upper polycrystalline portion formed on the lower monocrystalline silicon portion.

18. A method as in claim 13, and wherein, the first width of the upper surface area of the thick top silicon oxide layer is about 180 nm or less and the second width of the emitter surface area of the monocrystalline portion of the epitaxial layer is about 100-180 nm.

19. A method as in claim 13, and wherein the thin silicon oxide layer is about 20 nm thick, the silicon nitride layer is about 20 nm thick, and the thick top silicon oxide layer is about 250-500 nm thick.

20. A method as in claim 13, and wherein the epitaxial layer is formed from material selected from the group consisting of Si, SiGe, SiGe—C and combinations thereof.

* * * * *